(12) United States Patent
Jereza

(10) Patent No.: US 7,371,616 B2
(45) Date of Patent: May 13, 2008

(54) CLIPLESS AND WIRELESS SEMICONDUCTOR DIE PACKAGE AND METHOD FOR MAKING THE SAME

(75) Inventor: Armand Vincent C. Jereza, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 75 days.

(21) Appl. No.: 11/326,987

(22) Filed: Jan. 5, 2006

(65) Prior Publication Data

US 2007/0155058 A1 Jul. 5, 2007

(51) Int. Cl.
*H01L 21/00* (2006.01)

(52) U.S. Cl. ............... 438/123; 438/111; 257/666; 257/673

(58) Field of Classification Search ......... 438/111, 438/112, 123, 124, 126, 127; 257/666, 673, 257/676, 787
See application file for complete search history.

(56) References Cited

U.S. PATENT DOCUMENTS

| | | | |
|---|---|---|---|
| 5,349,238 A * | 9/1994 | Ohsawa et al. ............ 257/666 |
| 6,040,626 A | 3/2000 | Cheah et al. |
| 6,133,634 A | 10/2000 | Joshi |
| 6,369,441 B1 * | 4/2002 | Ohsawa et al. ............ 257/676 |
| 6,465,276 B2 | 10/2002 | Kuo |
| 6,489,678 B1 | 12/2002 | Joshi |
| 6,556,749 B2 | 4/2003 | Uetsuka et al. |
| 6,574,107 B2 | 6/2003 | Jeon et al. |
| 6,608,369 B2 * | 8/2003 | Sone ..................... 257/676 |
| 6,621,152 B2 | 9/2003 | Choi et al. |
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madria et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,254 B2 * | 5/2005 | Taniguchi ................ 438/123 |
| 6,891,256 B2 | 5/2005 | Joshi et al. |
| 6,891,257 B2 | 5/2005 | Chong et al. |
| 6,893,901 B2 | 5/2005 | Mudrid |
| 6,902,952 B2 * | 6/2005 | Hinkle et al. ............. 438/123 |
| 6,943,434 B2 | 9/2005 | Tangpuz et al. |

(Continued)

*Primary Examiner*—Kevin M Picardat
(74) *Attorney, Agent, or Firm*—Townsend and Townsend and Crew LLP

(57) ABSTRACT

A method for making a semiconductor die package is disclosed. In some embodiments, the method includes using a leadframe structure including at least one lead structure having a lead surface. A semiconductor die having a first surface and a second surface is attached to the leadframe structure. The first surface of the semiconductor die is substantially planar to the lead surface and the second surface of the semiconductor die is coupled to the leadframe structure. A layer of conductive material is formed on the lead surface and the first surface of the semiconductor die to electrically couple the at least one lead structure to the semiconductor die.

21 Claims, 11 Drawing Sheets

U.S. PATENT DOCUMENTS

| | | |
|---|---|---|
| 6,989,588 B2 | 1/2006 | Quinones et al. |
| 6,992,384 B2 | 1/2006 | Joshi |
| 7,224,045 B2 * | 5/2007 | Tabira et al. .............. 257/666 |
| 2002/0050912 A1 | 5/2002 | Shrier et al. |
| 2002/0096359 A1 | 7/2002 | Hsu et al. |
| 2002/0192935 A1 | 12/2002 | Joshi |
| 2003/0042403 A1 | 3/2003 | Joshi |
| 2003/0057551 A1 | 3/2003 | Datta et al. |
| 2003/0075786 A1 | 4/2003 | Joshi et al. |
| 2003/0107126 A1 | 6/2003 | Joshi |
| 2003/0122247 A1 | 7/2003 | Joshi |
| 2003/0173684 A1 | 9/2003 | Joshi et al. |
| 2003/0194278 A1 | 10/2003 | Sibilla |
| 2004/0018667 A1 | 1/2004 | Joshi et al. |
| 2004/0041242 A1 | 3/2004 | Joshi |
| 2004/0062759 A1 | 4/2004 | Abraham et al. |
| 2004/0070558 A1 | 4/2004 | Joshi et al. |
| 2004/0125573 A1 | 7/2004 | Joshi et al. |
| 2004/0137724 A1 | 7/2004 | Joshi et al. |
| 2004/0159939 A1 | 8/2004 | Joshi |
| 2004/0159944 A1 | 8/2004 | Datta et al. |
| 2004/0159947 A1 | 8/2004 | Datta et al. |
| 2004/0178481 A1 | 9/2004 | Joshi et al. |
| 2004/0191955 A1 | 9/2004 | Joshi et al. |
| 2004/0201081 A1 | 10/2004 | Joshi et al. |
| 2004/0207052 A1 | 10/2004 | Joshi et al. |
| 2005/0012225 A1 | 1/2005 | Choi et al. |
| 2005/0062143 A1 | 3/2005 | Joshi et al. |
| 2005/0104168 A1 | 5/2005 | Choi et al. |
| 2005/0127483 A1 | 6/2005 | Joshi et al. |
| 2005/0133893 A1 | 6/2005 | Joshi et al. |
| 2005/0167848 A1 | 8/2005 | Joshi et al. |
| 2005/0176233 A1 | 8/2005 | Joshi et al. |
| 2005/0200001 A1 | 9/2005 | Joshi et al. |
| 2005/0218300 A1 | 10/2005 | Quinones et al. |
| 2005/0275089 A1 | 12/2005 | Joshi et al. |
| 2005/0280126 A1 | 12/2005 | Joshi et al. |
| 2005/0285238 A1 | 12/2005 | Joshi et al. |
| 2005/0285240 A1 * | 12/2005 | Miyake et al. .............. 257/676 |
| 2006/0003492 A1 | 1/2006 | Joshi |
| 2006/0006550 A1 | 1/2006 | Joshi |

* cited by examiner

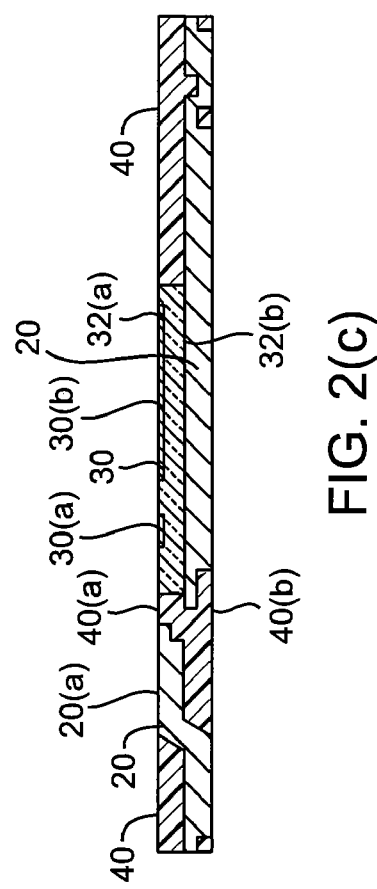
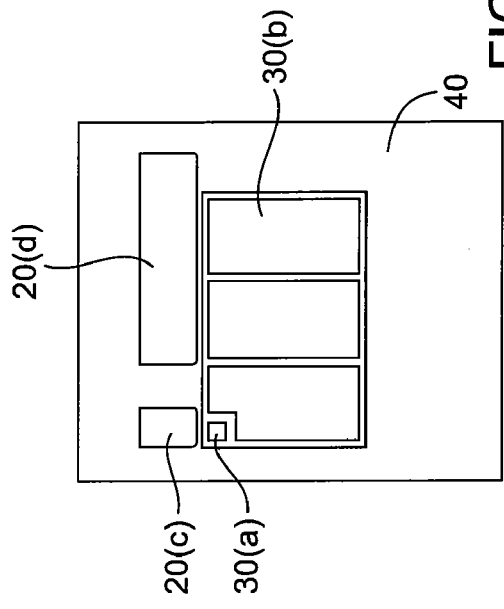
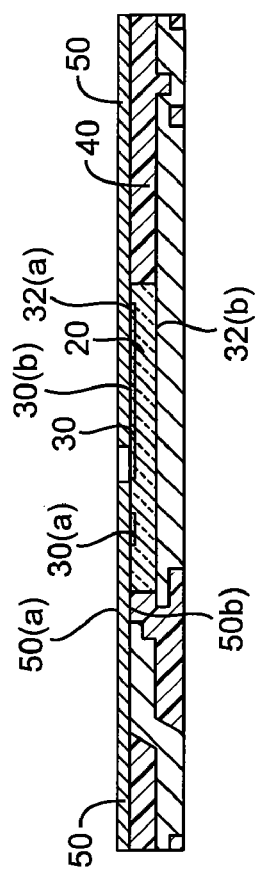
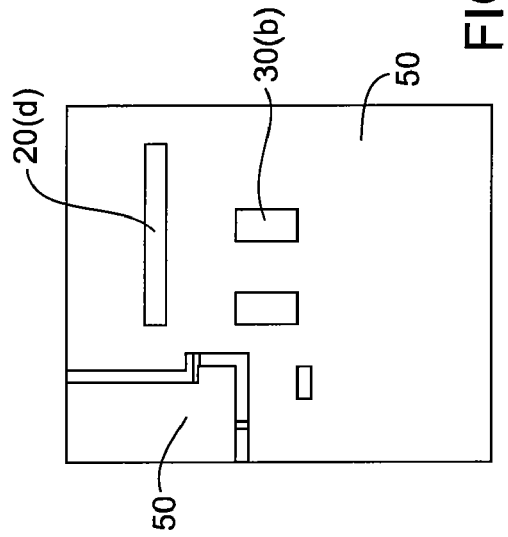

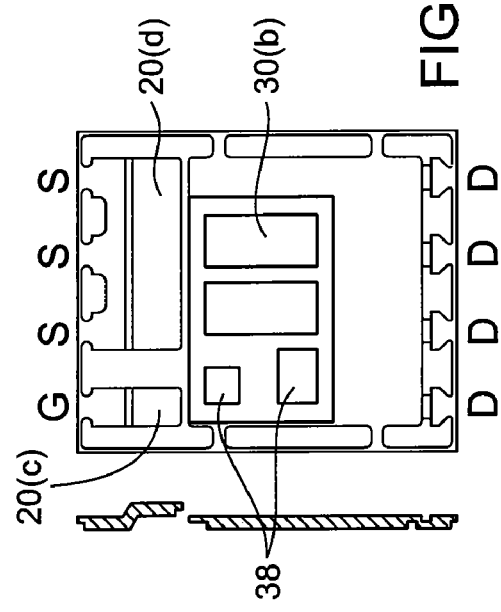
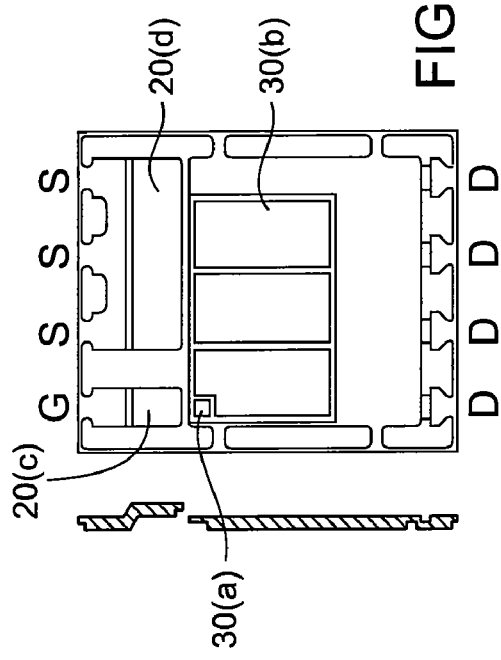
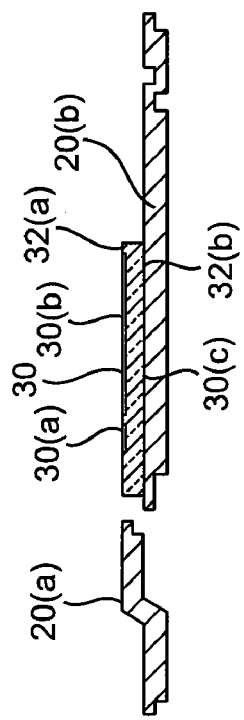
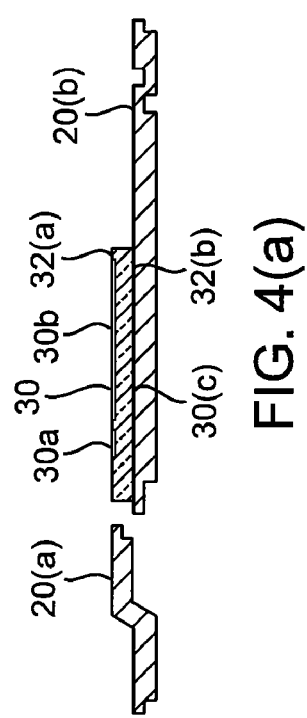

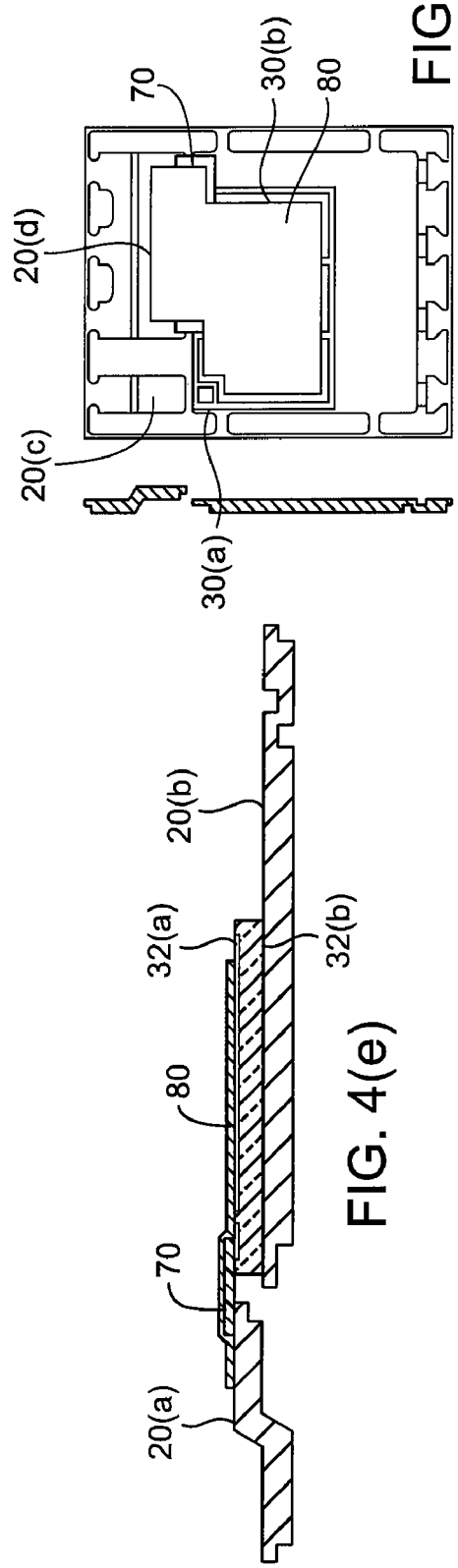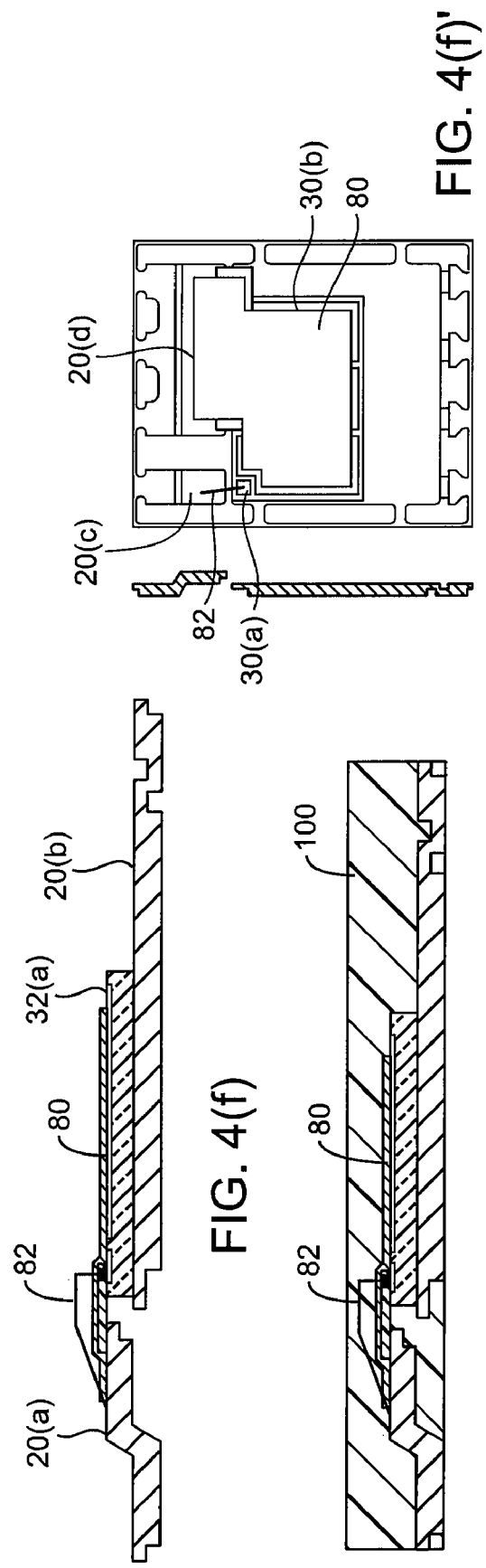

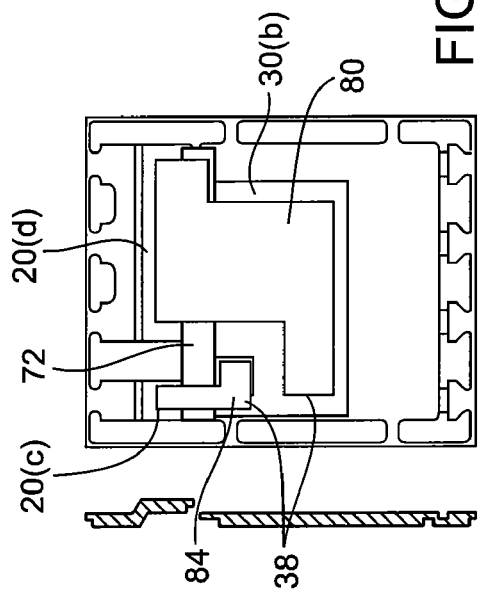
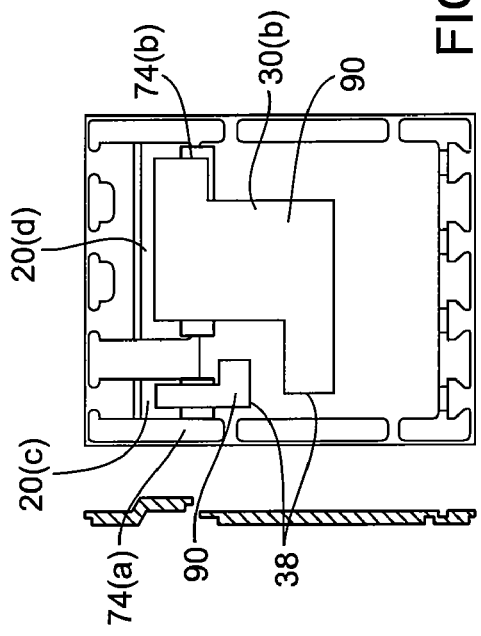
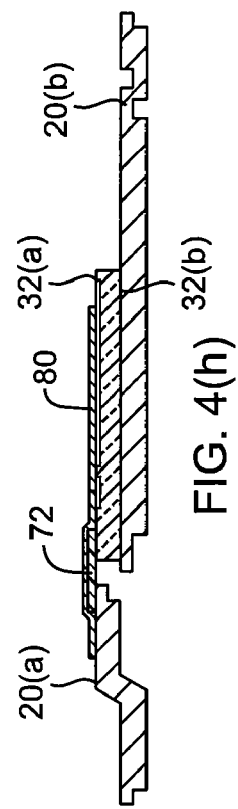
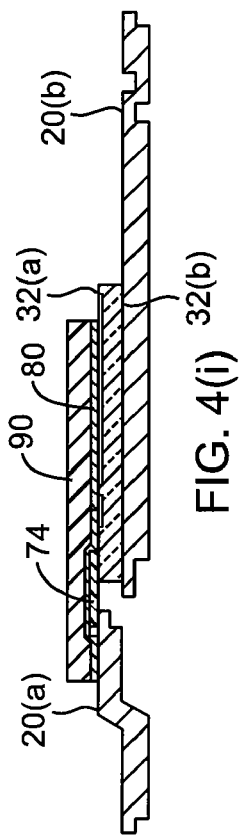
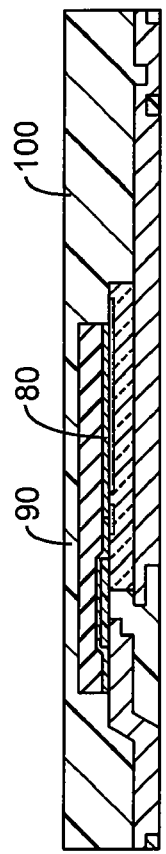

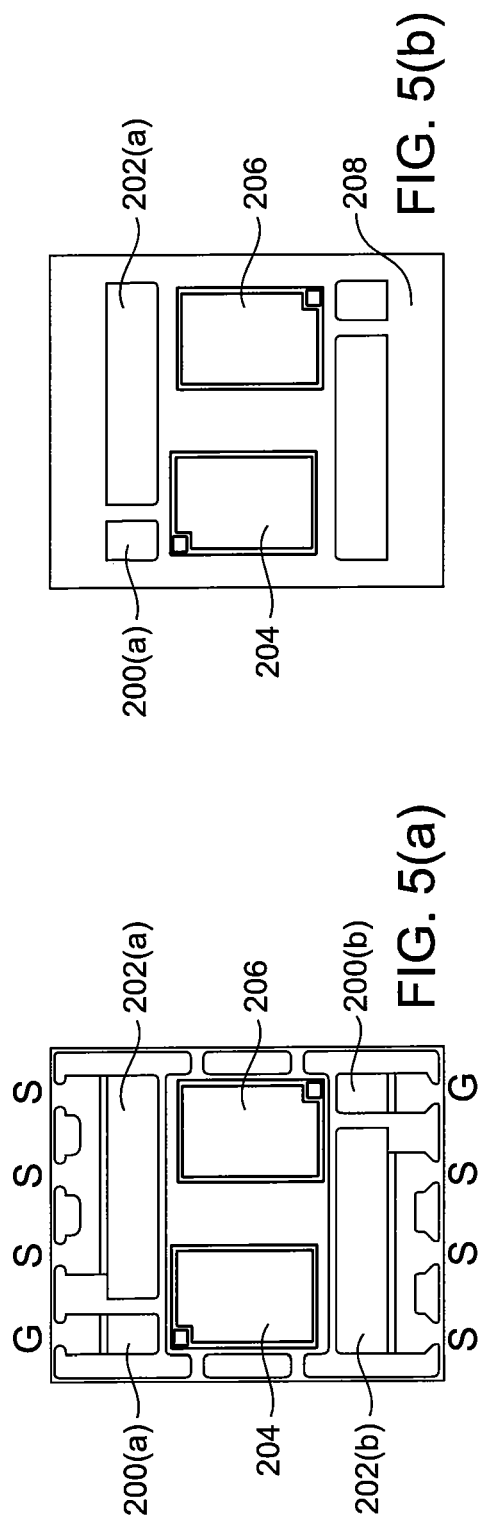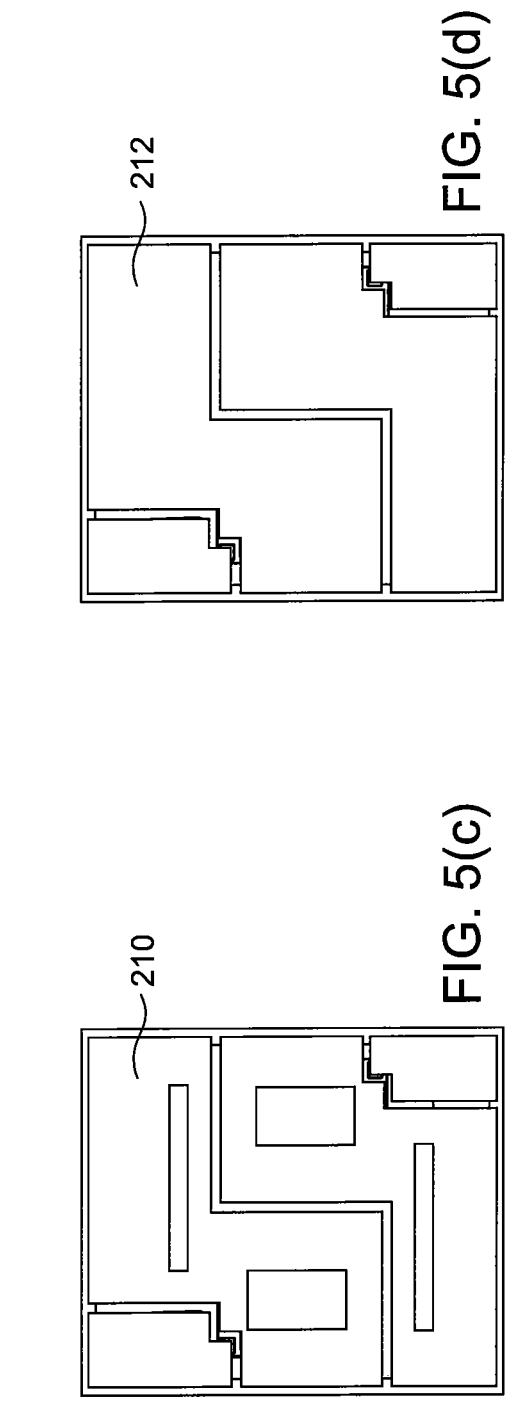

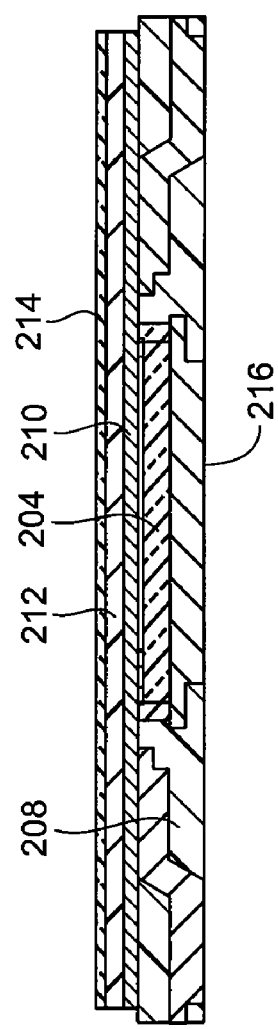
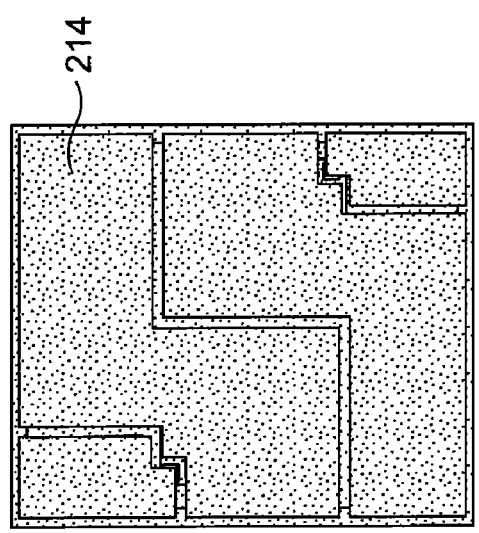
FIG. 5(f)
FIG. 5(e)

CLIPLESS AND WIRELESS SEMICONDUCTOR DIE PACKAGE AND METHOD FOR MAKING THE SAME

BACKGROUND OF THE INVENTION

There are a number of semiconductor die packages. Many semiconductor packages use wires to electrically connect source and gate regions on a semiconductor die to the source and gate leads on a leadframe. Many other semiconductor packages use clips instead of wires to form the external connections to external terminals. Such semiconductor die packages are sometimes referred to as "wireless" packages. A typical wireless package includes a clip that is attached to a semiconductor die. Wireless semiconductor die packages are generally preferred because they have better thermal and electrical properties than semiconductor die packages that use wires for terminal connections.

While clip bonded semiconductor packages are useful, improvements could be made. For example, one problem is the high cost of semiconductor package platforms that require clip bonding. The cost of a clip can be as high as the cost of the leadframe. Moreover, clip bonding requires expensive customized clip bonders and paste dispenser systems. Clip bonded packages thus have very high material and manufacturing costs.

Another problem that exists with clip bonding is the problem of applying inconsistent or uneven amounts of solder between the clip and the semiconductor die. When inconsistent or uneven amounts of solder are used between a die and a clip, the resulting packages may exhibit poor performance. And, as the feature sizes of microlead package (MLP) components get increasingly smaller, designs are constrained by the metal-to metal clearance and dimensional tolerance capabilities of etched and half-etched frame technology.

Embodiments of the invention address the above problems and other problems individually and collectively.

BRIEF SUMMARY OF THE INVENTION

Embodiments of the invention are directed to semiconductor die packages and methods for making semiconductor die packages. Some embodiments of the invention are directed to microlead packages (MLP). However, embodiments of the invention can be extended to other types of semiconductor die packages as well, such as to small outline (SO) packages.

One embodiment of the invention is directed to a method for forming a semiconductor die package, the method comprising: obtaining a leadframe structure including at least one lead structure having a lead surface; attaching a semiconductor die having a first surface and a second surface to the leadframe structure, wherein the first surface of the semiconductor die is substantially planar to the lead surface and the second surface of the semiconductor die is coupled to the leadframe structure; and forming a layer of conductive material on the lead surface and the first surface of the semiconductor die to electrically couple the at least one lead structure to the semiconductor die.

Another embodiment of the invention is directed to a semiconductor die package comprising: a leadframe structure including at least one lead structure having a lead surface; a semiconductor die having a first surface and a second surface on the leadframe structure, wherein the first surface of the semiconductor die is substantially planar to the lead surface and the second surface of the semiconductor die is coupled to the leadframe structure; and a conductive film on the lead surface and the first surface of the semiconductor die and coupling the at least one lead structure to the first surface of the semiconductor die.

BRIEF DESCRIPTION OF THE DRAWINGS

FIG. 2(a)' shows a top view of a leadframe structure according to an embodiment of the invention.

FIG. 2(b)' shows a top view of a semiconductor die mounted on a leadframe structure according to an embodiment of the invention.

FIG. 2(c) shows a side cross-sectional view of a semiconductor die mounted on a leadframe structure with a molding material.

FIG. 2(c)' shows a top view of a semiconductor die mounted on a leadframe structure with a molding material.

FIG. 2(d) shows a side cross-sectional view of a semiconductor die mounted on a leadframe structure with a molding material and a layer of conductive material.

FIG. 2(d)' shows a top view of a semiconductor die mounted on a leadframe structure with a molding material and a layer of conductive material.

FIG. 2(e)' shows a top view of a semiconductor die mounted on a leadframe structure with a molding material, a layer of conductive material, and an overlying layer of solder paste.

FIG. 4(a) shows a side cross-sectional view of a semiconductor die mounted on a leadframe structure according to an embodiment of the invention.

FIG. 4(a)' shows a top view of a semiconductor die mounted on a leadframe structure according to an embodiment of the invention.

FIG. 4(b) shows a side cross-sectional view of a modified semiconductor die mounted on a leadframe structure according to an embodiment of the invention.

FIG. 4(b)' shows a top view of a modified semiconductor die mounted on a leadframe structure according to an embodiment of the invention.

FIG. 4(c)' shows a top view of a semiconductor die mounted on a leadframe structure with a non conductive mask.

FIG. 4(d)' shows a top view of a modified semiconductor die mounted on a leadframe structure with a non conductive mask.

FIG. 4(e) shows a side cross-sectional view of a semiconductor die mounted on a leadframe structure with a non conductive mask and a layer of conductive material for the source connection.

FIG. 4(e)' shows a top view of a semiconductor die mounted on a leadframe structure with a non conductive mask and a layer of conductive material for the source connection.

FIG. 4(f) shows a side cross-sectional view of a semiconductor die mounted on a leadframe structure with a non conductive mask, a layer of conductive material for the source connection and a wire bond for the gate connection.

FIG. 4(f)' shows a top view of a semiconductor die mounted on a leadframe structure with a non conductive mask, a layer of conductive material for the source connection and a wire bond for the gate connection.

FIG. 4(g) shows a side cross-sectional view of a semiconductor die mounted on a leadframe structure with a non conductive mask, a layer of conductive material for the source connection, a wire bond for the gate connection and an encapsulant over the semiconductor package.

FIG. 4(h) shows a side cross-sectional view of a modified semiconductor die mounted on a leadframe structure with a continuous strip of a non conductive mask, a layer of conductive material for the source and gate connections.

FIG. 4(h)' shows a top view of a modified semiconductor die mounted on a leadframe structure with a continuous strip of a non conductive mask, a layer of conductive material for the source and gate connections.

FIG. 4(i) shows a side cross-sectional view of a modified semiconductor die mounted on a leadframe structure with two strips of a non conductive mask, a layer of conductive material for the source and gate connections, and an overlying solder paste.

FIG. 4(i)' shows a top view of a modified semiconductor die mounted on a leadframe structure with two strips of a non conductive mask, a layer of conductive material for the source and gate connections, and an overlying solder paste.

FIG. 4(j) shows a side cross-sectional view of a modified semiconductor die mounted on a leadframe structure with two strips of non conductive mask, a layer of conductive material for the source and gate connections, an overlying solder paste and an encapsulant over the semiconductor package.

FIG. 5(a) shows a top view of a multi-die platform comprising two semiconductor dies mounted on a leadframe structure according to an embodiment of the invention.

FIG. 5(b) shows a top view of a multi-die platform comprising two semiconductor dies mounted on a leadframe structure with a molding material.

FIG. 5(c) shows a top view of a multi-die platform comprising two semiconductor dies mounted on a leadframe structure with a molding material and a conductive material.

FIG. 5(d) shows a top view of a multi-die platform comprising two semiconductor dies mounted on a leadframe structure with a molding material, a layer of conductive material, and an overlying layer of solder paste.

FIG. 5(e) shows a top view of a multi-die platform comprising two semiconductor dies mounted on a leadframe structure with a molding material, a layer of conductive material, an overlying layer of solder paste, and an encapsulant over the semiconductor package.

FIG. 5(f) shows a side cross-sectional view of a multi-die platform comprising two semiconductor dies mounted on a leadframe structure with a molding material, a layer of conductive material, an overlying layer of solder paste, and an encapsulant over the semiconductor package.

DETAILED DESCRIPTION

Embodiments of the present invention address the above problems and other problems by providing completely, or substantially completely, clipless and wireless interconnection in a package, while maintaining the advantages of a clip-bonded package over a wire-bonded package. Such advantages include low on-resistance ($R_{DSon}$) and high current-carrying capabilities.

Another benefit of such a package is the low cost of completely or substantially completely clipless and wireless platforms. Since the cost of a clip is typically as high as the cost of the leadframe structure, a clipless package would significantly decrease the material cost of platforms for semiconductor die packages. Moreover, while clip bonding requires expensive custom made clip bonders and paste dispenser systems, embodiments of the present invention can use only a standard screen printer. Thus, manufacturing costs are also decreased. Accordingly, the costs associated with drop-in replacements for existing standard packages are also decreased.

A wireless and clipless package according to an embodiment of the invention does not use or substantially reduces the number of wires or clip structures needed to connect to input and/or output terminals in an electrical device in a semiconductor die to a leadframe structure of the like. In a semiconductor die package according to an embodiment of the invention, instead of clip or wirebonds, the semiconductor die package comprises a layer of conductive material over the leadframe structure and the semiconductor die to electrically couple at least one lead structure in the leadframe structure to terminals in the semiconductor die.

Figure 1:
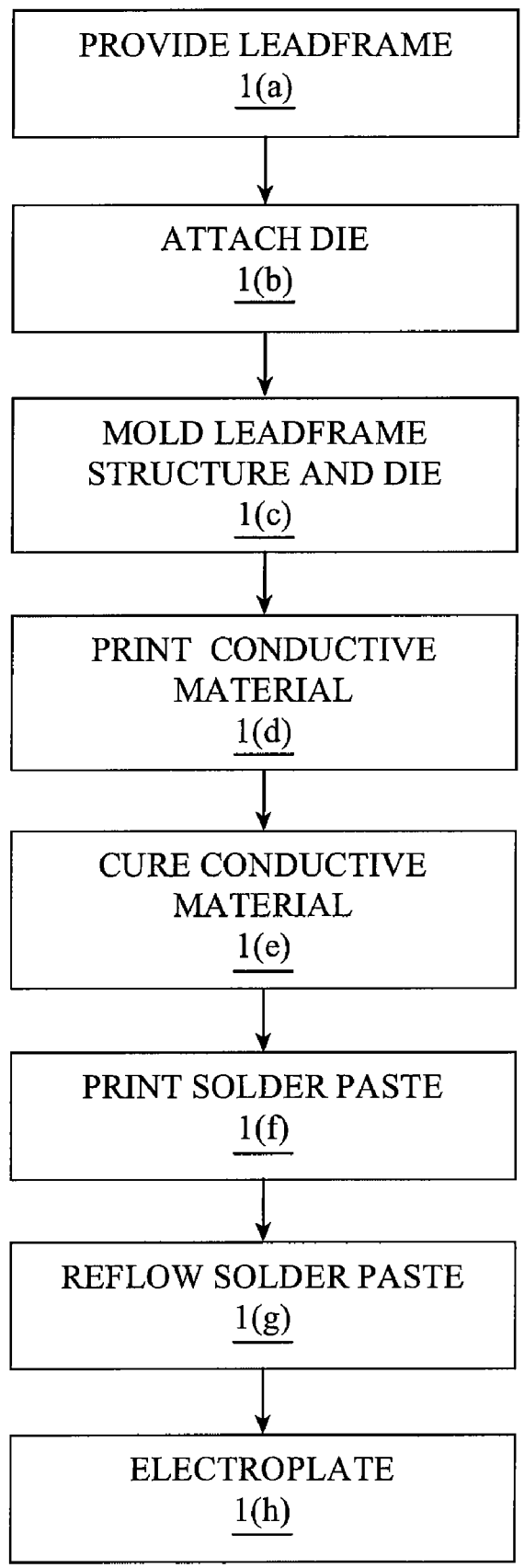
FIG. 1 shows a flowchart illustrating a method according to an embodiment of the invention.

FIG. 1 shows a flowchart illustrating an exemplary process flow according to an embodiment of the invention. Each step in the flowchart is described in further detail below, with respect to FIGS. 2(a)-2(e)'.

Figure 2A:
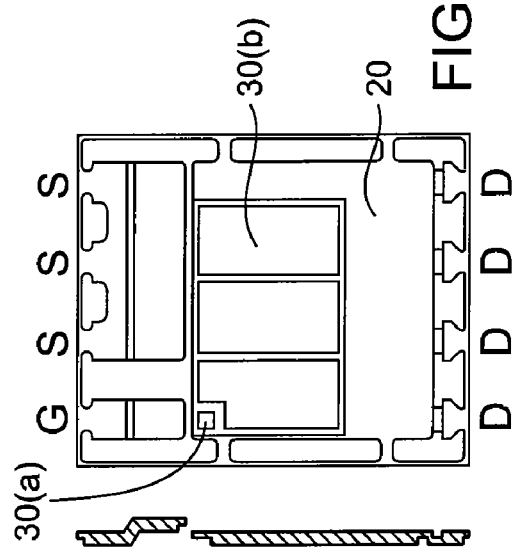
FIG. 2(a) shows a side cross-sectional view of a leadframe structure according to an embodiment of the invention.

First, a leadframe structure is provided, as indicated by step 1(a) of FIG. 1. The term "leadframe structure" can refer to a structure that is derived from or is the same as a leadframe. FIG. 2(a) shows a cross-sectional view of a leadframe structure 20 and FIG. 2(a)' shows a top view of the leadframe structure 20. Each leadframe structure can include two or more leads with lead surfaces 20(a), and a die attach region 20(b). The leads extend laterally from the die attach region 20(b). A single lead frame structure may include a gate lead structure 20(c), and a source lead structure 20(d). In FIG. 2(a)', exemplary designations of G, S and D refer to gate, source and drain lead fingers, respectively. The gate and source lead fingers and structures are electrically isolated from each other in the semiconductor package that is eventually formed.

The leadframe structure 20 may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure 20 may also have any suitable thickness, including a thickness less than about 1 mm (e.g., less than about 0.5 mm).

The leadframe structure can be etched and/or patterned using conventional processes to shape the leads or other portions of the leadframe structure. For example, the leadframe structure can be formed by etching a continuous conductive sheet to form a predetermined pattern. Before or after etching, the leadframe structures can also be stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframes structures. As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure.

Figure 2B:
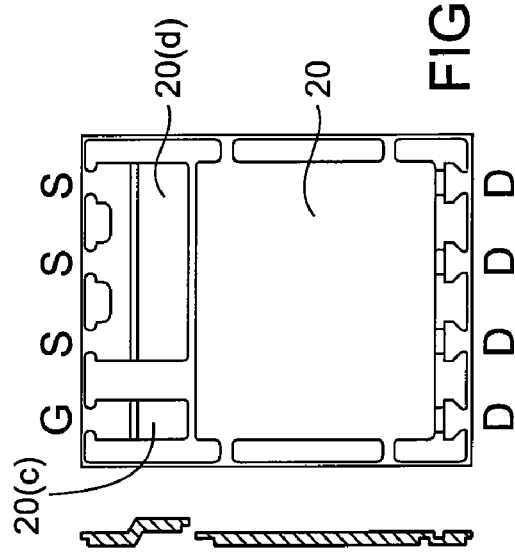
FIG. 2(b) shows a side cross-sectional view of a semiconductor die mounted on a leadframe structure according to an embodiment of the invention.
Figure 2A:
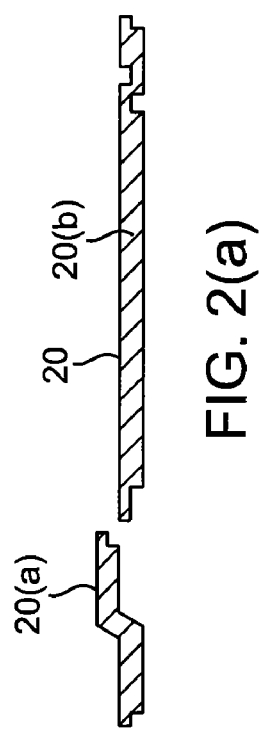
Figure 2B:
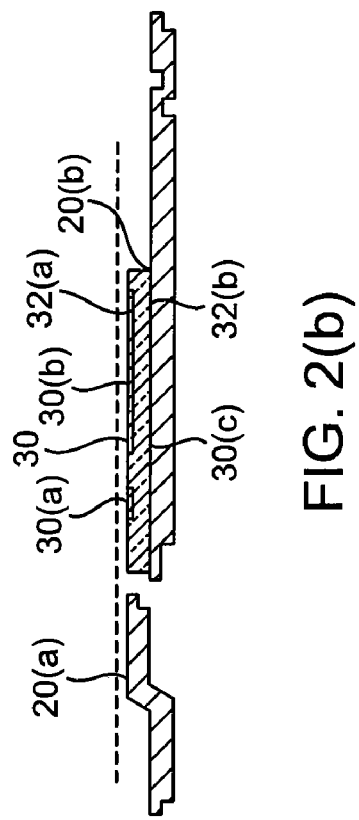

After a leadframe structure is obtained, at least one semiconductor die is mounted on and attached to the leadframe structure, as indicated by step 1(b) of FIG. 1. FIG. 2(b) shows semiconductor die 30 having a first surface 32(a) and a second surface 32(b) mounted on the leadframe structure 20. The second surface 32(b) of the semiconductor die 30 is proximate to the die attach region 20(b) of the leadframe structure 20. Any suitable adhesive or solder can be used to attach the semiconductor die 30 to the leadframe structure 20 at the die attach region 20(b) of the leadframe structure 20.

The semiconductor die 30 can include a gate region 30(a) and a source region 30(b) at the first surface 32(a) of the semiconductor die 30, and a drain region 30(c) at the second surface 32(b) of the semiconductor die 30. The gate region 30(a) and the source region 30(b) are shown in the top view of FIG. 2(b)'. In a preferred embodiment of the invention, the first surface 32(a) of semiconductor die 30 is substantially coplanar to the lead surface 20(a) of the leadframe structure 20, as shown by the dotted line in FIG. 2(b).

The semiconductor die 30 may be any suitable semiconductor device. Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. Exemplary vertical power devices are also described in U.S. patent application Ser. Nos. 6,274,905 and 6,351,018, both of which are assigned to the same assignee as the present application, and both of which are herein incorporated by reference in their entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

Two preferred embodiments of the invention are further described below with respect to the processing of the semiconductor die package after the semiconductor die 30 is attached to the leadframe structure 20 at the die attach region 20(b).

I. Process Flow A

After the semiconductor die 30 is attached to the leadframe structure 20, a molding material 40 may be formed around at least a portion of the leadframe structure 20 and the die 30 to provide a molded structure including the leadframe structure 20, and the die 30, as indicated by step 1(c) in FIG. 1. A molded structure in general has a lower warpage and higher overall panel rigidity than other structures. As shown in FIG. 2(c), molding material 40 with a first surface 40(a) and a second surface 40(b) covers the leadframe structure 20. Typically, at least one surface of the leadframe structure 20, such as lead surface 20(a), is substantially coplanar with the first surface 40(a) of the molding material 40. In the preferred embodiment shown in FIG. 2(c), the first surface 32(a) of semiconductor die 30 also shares a common plane with the lead surface 20(a) and first surface 40(a) of molding 40. The molded structure shown in FIG. 2(c)' also shows that surfaces of the gate region 30(a) and source region 30(b) of the semiconductor die 30 and surfaces of the gate lead structure 20(c) and source lead structure 20(d) all share a common plane and are exposed through the molding material 40.

Any suitable molding process including a film or tape-assisted transfer molding process may be used. For example, in a tape-assisted, single-sided molding process, the leadframe structure 30 and the semiconductor die 20 are adhered to an adhesive side of a tape structure. This combination is then placed in a mold cavity of a mold. Molding material 40 (in liquid or semi-liquid form) is then introduced into the molding chamber under the leadframe structure 20, and the molding material 40 passes upward and fills the interstices in the leadframe structure 20. Once the molding material solidifies, the tape structure, the leadframe structure 20, and the molding material 40 can be removed from the chamber. Excess molding material could be removed from the side of the leadframe structure 20 opposite the tape structure before or after it is solidified. The tape structure can then be separated from the leadframe structure 20 and the semiconductor die 30. The surfaces of the leadframe structure 20 and the semiconductor die 30 that were in contact with the tape structure, such as lead structures 20(c) and 20(d) and die regions 30(a) and 30(b), are exposed through the solidified molding material 40. In other embodiments, two molding dies can be used instead of a tape-assisted process.

After molding the leadframe structure 20 and semiconductor die 30 with molding material 40, debar, deflash and dejunk processes can be performed. Deflash and dejunk processes that are known in the art can be used to remove excess molding material.

The molding material 40 may be any suitable material for molding, such as biphenyl-based materials and multi-functional, cross-linked epoxy resin composite materials. If the lead structures 20(c) and 20(d) of the leadframe structure 20 do not extend laterally outward past the molding material 40, the semiconductor package can be considered a "leadless" package. If the lead structures 20(c) and 20(d) of the leadframe structure 20 do extend past the molding material 40, then the semiconductor package may be a "leaded package."

After the semiconductor die 30 is attached to the leadframe structure 20, the top surface 32(a) and/or the bottom surface 32(b) of the semiconductor die 30 may be electrically coupled to conductive regions of the leadframe structure, such as lead structures 20(c) and 20(d). Typically, the semiconductor die 30 and the conductive portions of the leadframe structure have been wirebonded together. Alternatively, conductive clips have been used to electrically couple the semiconductor die 30 to the conductive portions of the leadframe structure 20. However, preferred embodiments of the invention eliminate the need for wire bonding or conductive clips altogether.

Instead, in embodiments of the invention, the electrical connection between the semiconductor die 30 and the lead structures 20(c) and 20(d) is provided by a conductive film or layer of conductive material over portions of the semiconductor die 30 and the leadframe structure 20 exposed through the molding 40, as indicated by step 1(d) of FIG. 1. According to the preferred embodiment shown in FIG. 2(d), a film or layer of conductive material 50 coats the molded structure with the exposed surfaces of the leadframe structure 20 and the semiconductor die 30 sharing a common plane. Conductive material 50 has an exterior first surface 50(a) and a second surface 50(b) that contacts the leadframe structure 20, semiconductor die 30, and molding material 40. The conductive material 50 may form a first conductive layer in some embodiments.

The film or layer of conductive material 50 can be formed in various ways. Exemplary film forming processes include screen printing, vapor deposition, roller coating, spin coating, curtain coating, etc. Additive or subtractive processes can also be used. In an exemplary embodiment, the molded structure can be placed on a work surface or tape, before the conductive material 50 is deposited or applied through a mask. The conductive material 50 is then cured, as indicated by step 1(e) of FIG. 1. When the conductive material 50 solidifies, the mask can then be removed or peeled from the molded structure. The portions of the leadframe structure 20 that were previously covered by the mask would be free of conductive material 50 and would thus be exposed through the solidified conductive material 50. Portions of the semiconductor die 30 and leadframe structure 20 that are exposed by screen printing include a portion of the source lead structure 20(d) and source region of the semiconductor 30(b), as shown in FIG. 2(d)'. Exposed portions of the semiconductor die 30 and source lead structure 20(d) can allow subsequent solder printing or electroplating to attach directly to the surfaces underlying the conductive material 50, and thus anchor onto the conductive material 50. This will increase the reliability and decrease the resistance of the electrical connection, and also increase the cross section of the conductive trace.

Figure 2E:
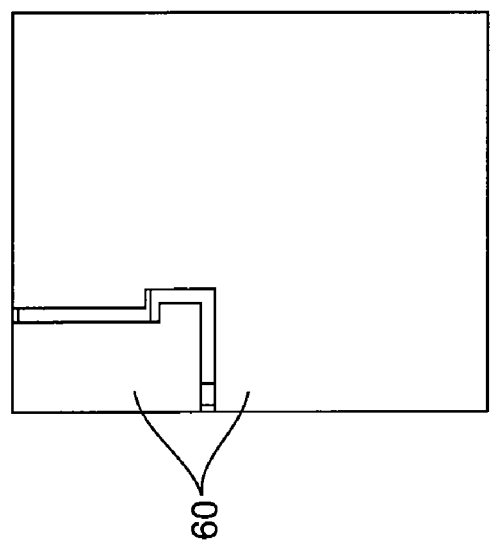
FIG. 2(e) shows a side cross-sectional view of a semiconductor die mounted on a leadframe structure with a molding material, a layer of conductive material, and an overlying layer of solder paste.
Figure 2E:
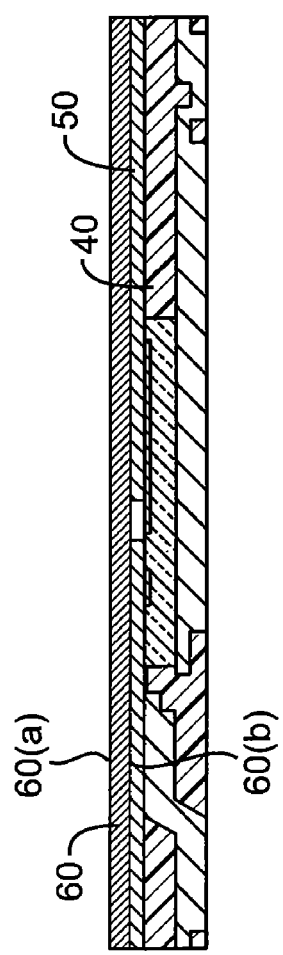

In one embodiment of the invention, the conductive material 50 serves as a seed layer or adhesion layer for the subsequent solder printing and/or electroplating. Subsequent solder printing, solder reflow, and electroplating processes, as indicated by steps 1(f)-1(h) of FIG. 1 can further improve the electrical performance of the contact between the semiconductor die 30 and the lead structures 20(c) and 20(d). Subsequent printing with solder paste is shown in FIGS. 2(e) and 2(e)'. The solder paste 60 coverage may be larger than that of the conductive material 50 so that the solder paste 60 can anchor onto the conductive material 50 and provide a more reliable electrical connection. The layer of solder paste 60 may form a second conductive layer in some embodiments. As shown, there are two discrete solder regions that respectively correspond to the gate and source connections.

The layer of conductive material 50 and the layer of solder paste 60 may have any suitable thicknesses. For example, the thickness of the layer of conductive material 50 may be less than about 50 microns in some embodiments. The thickness of the layer of solder paste 60 may be less than about 100 microns in some embodiments.

The coverage of the conductive layer 50, the subsequent solder paste 60 and/or electroplating, may be smaller than the size of the molded structure of leadframe 20, semiconductor die 30 and molding 40, to maintain an exposed mold around the edges of the semiconductor package. This can prevent solder bridging during board mounting.

After the semiconductor die 30 is electrically coupled to the gate and source lead structures by the conductive layer 50 and subsequent layers of solder 60 and/or electroplating, an encapsulating material (not shown) may be deposited over the entire semiconductor die package to protect its components. The encapsulating material may comprise the same or different type of material as the previously described molding material, such as bi-phenyl materials, and multi-functional cross-linked epoxy resin composites. In some embodiments, the encapsulating material may be different than the molding material. Any suitable encapsulating material may be used.

II. Process Flow B

Figure 3:
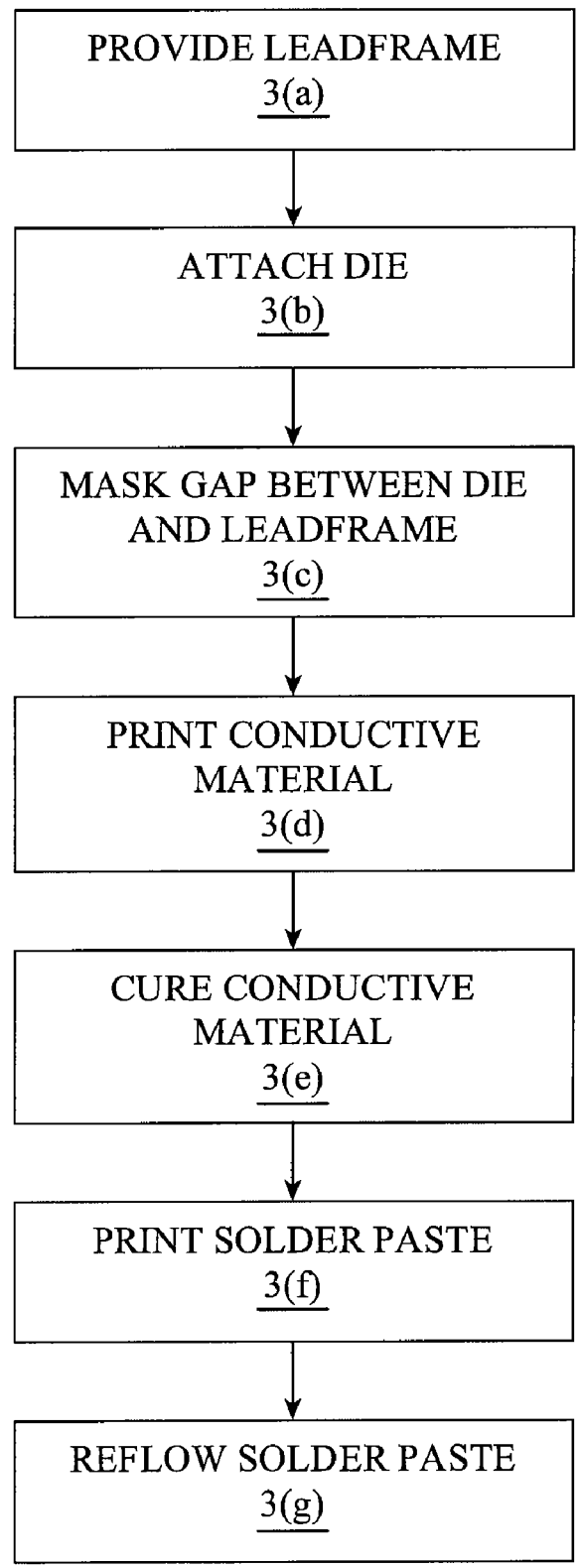
FIG. 3 shows a flowchart illustrating a method according to another embodiment of the invention.

FIG. 3 shows a flowchart illustrating an exemplary process flow according to an alternative preferred embodiment of the invention. Each step in the flowchart is described in further detail below, with respect to FIGS. 4(a)-4(j)'.

FIGS. 4(a) and 4(a)' show process steps identical to the steps of Process Flow A detailed above in providing a leadframe structure 20, indicated by step 3(a), and attaching a semiconductor die 30 on the leadframe structure 20, indicated by step 3(b). The semiconductor die 30 has a first surface 32(a) and a second surface 32(b) with the second surface 32(b) proximate to the leadframe structure 20 and the first surface 32(a) having a common plane with lead surface 20(a). FIGS. 4(b) and 4(b)' show another embodiment of the invention that uses a modified semiconductor die to increase the gate and source to die edge clearance. FIG. 4(b)' shows a top view of the modified gate and source regions 38 of the modified semiconductor die 30.

Figure 4C:
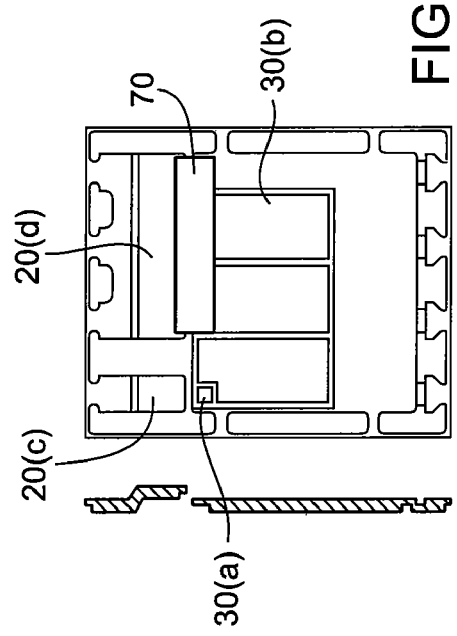
FIG. 4(c) shows a side cross-sectional view of a semiconductor die mounted on a leadframe structure with a non conductive mask.
Figure 4D:
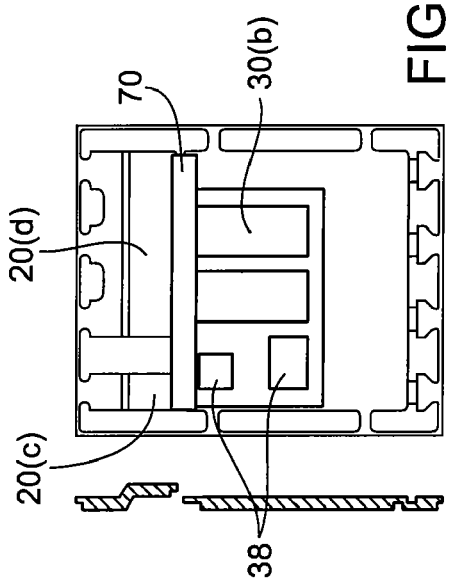
FIG. 4(d) shows a side cross-sectional view of a modified semiconductor die mounted on a leadframe structure with a non conductive mask.
Figure 4C:
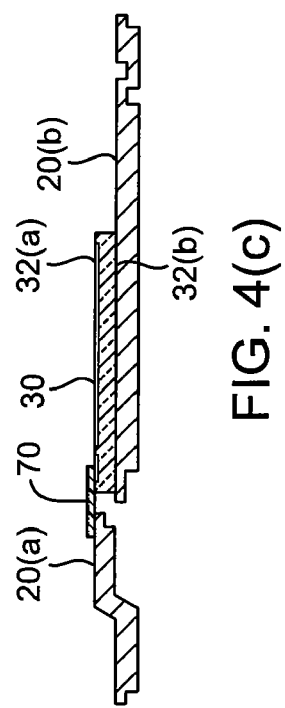
Figure 4D:
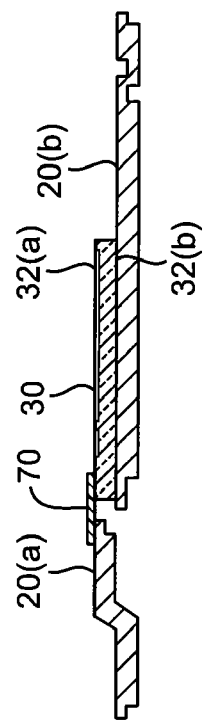

After the semiconductor die 30 is attached to the leadframe structure 20, the molding step detailed in Process Flow A as shown in FIG. 2(c) is not performed. Instead, step 3(c) of FIG. 3 indicates that a gap between the semiconductor die 30 and the leadframe structure 20 is covered by a non conductive material. This step may be achieved by printing a solder mask, or placing a tape or adhesive, over the gap between the lead surface 20(a) and the first surface of the semiconductor die 32(a), as shown in FIGS. 4(c)-4(d). The non conductive mask or tape 70 prevents the subsequent conductive material from flowing through the gap between the surface 20(a) of the leadframe structure and the semiconductor die 30.

In the embodiment shown in FIGS. 4(c) and 4(c)', the solder mask, non conductive adhesive or tape application 70 covers the gap between the source lead structure 20(d) and the source region 30(b) of the semiconductor die 30. This method allows the use of existing semiconductor dies. Another embodiment shown in FIGS. 4(d) and 4(d)' shows the modified semiconductor die of FIGS. 4(b) and 4(b)'. The solder mask, non conductive adhesive or tape application 70 covers the modified gate and source regions 38 for the modified semiconductor die embodiment.

After the solder mask or non conductive adhesive 70 is dispensed or applied, a conductive material is printed and cured over the semiconductor package, as indicated by steps 3(d) and 3(e) in FIG. 3. FIGS. 4(e) and 4(e)' show that the conductive layer 80 provides the source connection between the leadframe structure 20 and the semiconductor die 30. A conductive material 80 is deposited or applied over source lead surface 20(d), non conductive material 70, and source region 30(b) of the semiconductor die 30, to provide the electrical connection between the leads and semiconductor die. The conductive material 80 may be any of the materials and formed by any of the methods as previously described above for the film or layer of conductive material 50 in Process Flow A.

In one embodiment of the invention, the gate connection may be provided by wire bonding. For example, wire bond 82 is shown in FIGS. 4(f) and 4(f)' to electrically connect the gate region 30(a) of semiconductor die 30 to the gate lead structure 20(c) of leadframe structure 20. In an alternative embodiment, this gate connection may be provided by a film or layer of conductive material 84, as shown in FIGS. 4(h)', instead of a wire bond 82.

FIGS. 4(h)-4(i)' show the modified semiconductor structure with the modified gate and source regions 38. In the embodiment of the modified semiconductor structure shown in FIGS. 4(h) and 4(h)', the non conductive layer or adhesive 72 is applied in a single strip across the gate lead structure 20(c) and source lead structure 20(d). In another embodiment of the modified semiconductor structure shown in FIGS. 4(i) and 4(i)', the non conductive layer or adhesive is applied in two strips 74(a) and 74(b). Non-conductive strip 74(a) covers the gap between gate lead structure 20(c) and semiconductor gate region 30(a), and non conductive strip 74(b) covers the gap between the source lead structure 20(d) and semiconductor source region 30(b).

Steps 3(f) and 3(g) of FIG. 3 show that for some embodiments, a solder paste can be printed above the conductive material and subsequently reflowed to enhance the electrical properties of the semiconductor package. The solder paste over the source and gate connections will reduce the conductive trace resistance and increase the current handling capabilities. FIGS. 4(i)-4(i)' show that the solder paste 90 is applied directly over the film or layer of conductive material 80.

In one embodiment of the invention, the conductive material 80 will act as a seed layer or adhesion layer for the subsequent solder paste printing process. The coverage of solder paste 90 as shown in FIG. 4(i)' may also be larger than the conductive layer 80, so that the solder 90 may anchor onto the conductive material 80. This will result in a reliable and low-resistance connection.

Finally, an encapsulant 100 may cover the semiconductor package as shown in FIG. 4(g) for the embodiment with the wire-bonded gate connection 82, and in FIG. 4(j) for the embodiment with the conductive layer gate connection 84. As for Embodiment A, the encapsulating material may comprise the same or different type of material as the molding material, such as bi-phenyl materials, and multi-functional cross-linked epoxy resin composites.

FIGS. 5(a)-5(e) show the process steps of an embodiment according to Process Flow A providing a multi-die platform. For example, FIG. 5(a) shows a leadframe structure with two semiconductor dies mounted on different sides of the leadframe structure. The gate lead structures are found on both sides of the die, at 200(a) and 200(b). The source lead structures are also on both sides of the die at 202(a) and 202(b). The semiconductor die 204 is connected to the gate and source lead structures of 200(a) and 202(a) and the semiconductor die 206 is connected to the gate and source lead structures of 200(b) and 202(b). The gate and source lead fingers are shown at G and S, respectively, on both sides of the leadframe structure.

In FIG. 5(b), a molding material 208 covers portions of the leadframe structure and the semiconductor dies 204 and 206. As according to Process Flow A, portions of the leadframe structure 200(a) and 202(a) are exposed, as are portions of semiconductor die 204 and 206. FIG. 5(c) shows a layer of conductive material 210 printed and cured over the semiconductor package in the same manner described in Process Flow A. FIG. 5(d) shows a layer of electroplating 212 over the layer of conductive material 210. FIG. 5(e) shows the semiconductor die with an encapsulant 214 over the electroplating layer 212. FIG. 5(f) shows a cross section of all the layers of the semiconductor die package throughout the process steps shown in FIGS. 5(a)-5(e). In FIG. 5(f), the exposed drain connection is indicated by reference number 216 at the bottom of the semiconductor die package.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patent applications, patents and publications noted above are herein incorporated by reference in their entirety for all purposes. None is admitted to be prior art.

What is claimed is:

1. A method for forming a semiconductor die package, the method comprising:
    obtaining a leadframe structure including at least one lead structure having a lead surface;
    attaching a semiconductor die having a first surface and a second surface to the leadframe structure, wherein the first surface of the semiconductor die is substantially planar to the lead surface and the second surface of the semiconductor die is coupled to the leadframe structure; and
    forming a layer of conductive material on the lead surface and the first surface of the semiconductor die to electrically couple the at least one lead structure to the semiconductor die.

2. A method for forming a semiconductor die package, the method comprising:
    obtaining a leadframe structure including at least one lead structure having a lead surface;
    attaching a semiconductor die having a first surface and a second surface to the leadframe structure, wherein the first surface of the semiconductor die is substantially planar to the lead surface and the second surface of the semiconductor die is coupled to the leadframe structure; and
    forming a layer of conductive material on the lead surface and the first surface of the semiconductor die to electrically couple the at least one lead structure to the semiconductor die, and wherein the method further comprises molding a molding material around at least one part of the leadframe structure and the semiconductor die, wherein the lead surface and the first surface of the semiconductor die are exposed through the molding material after the molding.

3. A method for forming a semiconductor die package, the method comprising:
    obtaining a leadframe structure including at least one lead structure having a lead surface;
    attaching a semiconductor die having a first surface and a second surface to the leadframe structure, wherein the first surface of the semiconductor die is substantially planar to the lead surface and the second surface of the semiconductor die is coupled to the leadframe structure; and
    forming a layer of conductive material on the lead surface and the first surface of the semiconductor die to electrically couple the at least one lead structure to the semiconductor die, wherein the method further comprises placing a mask of non conductive material on the leadframe structure over a gap between the at least one lead structure and the semiconductor die.

4. The method of claim 1 further comprising forming a layer of solder paste over the layer of conductive material.

5. The method of claim 1 further comprising forming a second conductive layer on the layer of conductive material using electroplating.

6. The method of claim 1 further comprising forming a second conductive layer on the layer of conductive material using electroplating and forming a layer of protective material on the second conductive layer.

7. A semiconductor die package comprising:
a leadframe structure including at least one lead structure having a lead surface;
a semiconductor die having a first surface and a second surface on the leadframe structure, wherein the first surface of the semiconductor die is substantially planar to the lead surface and the second surface of the semiconductor die is coupled to the leadframe structure;
a conductive film on the lead surface and the first surface of the semiconductor die and coupling the at least one lead structure to the first surface of the semiconductor die; and
a molding material around at least part of the leadframe structure and the semiconductor die, wherein the lead surface and the first surface of the semiconductor die are exposed through the molding material.

8. A semiconductor die package comprising:
a leadframe structure including at least one lead structure having a lead surface;
a semiconductor die having a first surface and a second surface on the leadframe structure, wherein the first surface of the semiconductor die is substantially planar to the lead surface and the second surface of the semiconductor die is coupled to the leadframe structure;
a conductive film on the lead surface and the first surface of the semiconductor die and coupling the at least one lead structure to the first surface of the semiconductor die; and a molding material covering the leadframe structure and semiconductor die, wherein the semiconductor die comprises a vertical power device.

9. The semiconductor die package of claim 8 wherein the first surface of the semiconductor die is exposed through the molding material.

10. A semiconductor die package comprising:
a leadframe structure including at least one lead structure having a lead surface;
a semiconductor die having a first surface and a second surface on the leadframe structure, wherein the first surface of the semiconductor die is substantially planar to the lead surface and the second surface of the semiconductor die is coupled to the leadframe structure;
a conductive film on the lead surface and the first surface of the semiconductor die and coupling the at least one lead structure to the first surface of the semiconductor die; and a mask of non conductive material on the leadframe structure covering a gap between the at least one lead structure and the semiconductor die.

11. The semiconductor die package of claim 8 further comprising a layer of non conductive material on the leadframe structure covering a gap between the at least one lead structure and the semiconductor die, wherein the layer of non conductive material is a solder mask.

12. The semiconductor die package of claim 10 wherein the first surface of the semiconductor die comprises at least one gate region and at least one source region.

13. The semiconductor die package of claim 10 wherein the second surface of the semiconductor die comprises at least one drain region.

14. The semiconductor die package of claim 10 wherein the semiconductor die comprises at least one gate region and at least one source region, and the gate region is wire bonded to the at least one lead structure.

15. The semiconductor die package of claim 10 wherein the semiconductor die comprises a power MOSFET.

16. The method of claim 1 wherein the semiconductor die package is a leadless package.

17. The semiconductor die package of claim 7 wherein the semiconductor die package is a leadless package.

18. The method of claim 2 wherein forming the layer of conductive material comprises screen printing.

19. The semiconductor die package of claim 7 wherein the semiconductor die package is a wireless package.

20. A semiconductor die package comprising:
a leadframe structure including at least one lead structure having a lead surface;
a semiconductor die having a first surface and a second surface on the leadframe structure, wherein the first surface of the semiconductor die is substantially planar to the lead surface, and the second surface of the semiconductor die is coupled to the leadframe structure;
a non-conductive material on the leadframe structure covering a gap between the at least one lead structure and the semiconductor die; and
a conductive film on the lead surface, the non-conductive material and the first surface of the semiconductor die and coupling the at least one lead structure to the first surface of the semiconductor die.

21. The semiconductor die package of claim 20 wherein the non conductive material comprise tape.

* * * * *